(12) United States Patent
Yoo et al.

(10) Patent No.: US 11,424,770 B2
(45) Date of Patent: Aug. 23, 2022

(54) LINEARIZATION TECHNIQUES FOR WIRELESS DIGITAL TRANSMITTERS

(71) Applicant: Board of Trustees of Michigan State University, East Lansing, MI (US)

(72) Inventors: Sangmin Yoo, East Lansing, MI (US); Si-Wook Yoo, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 17/174,933

(22) Filed: Feb. 12, 2021

(65) Prior Publication Data

US 2021/0258027 A1    Aug. 19, 2021

Related U.S. Application Data

(60) Provisional application No. 62/975,862, filed on Feb. 13, 2020.

(51) Int. Cl.
| | | |
|---|---|---|
| *H04B 1/04* | (2006.01) | |
| *H03K 17/687* | (2006.01) | |
| *H03K 3/012* | (2006.01) | |

(52) U.S. Cl.
CPC .............. *H04B 1/04* (2013.01); *H03K 3/012* (2013.01); *H03K 17/6872* (2013.01)

(58) Field of Classification Search
CPC ..... H03F 1/02; H03F 1/32; H03F 1/56; H03F 3/00; H03F 3/24; H03K 3/012; H03K 7/06; H03K 17/687; H03K 17/6872; H04B 1/00; H04B 1/04; H04B 1/16; H04L 27/04; H04L 27/20
USPC ................... 370/278; 375/219, 295–297, 300
See application file for complete search history.

(56) References Cited

U.S. PATENT DOCUMENTS

| | | | |
|---|---|---|---|
| 10,666,306 B1 | 5/2020 | Yoo et al. | |
| 10,804,864 B2 | 10/2020 | Yoo et al. | |
| 2012/0106402 A1 | 5/2012 | Morimoto et al. | |
| 2016/0336909 A1* | 11/2016 | Walling | H03F 3/217 |
| 2019/0335118 A1* | 10/2019 | Simolon | H04N 5/33 |
| 2020/0007116 A1 | 1/2020 | Agrawal et al. | |

OTHER PUBLICATIONS

Sang-Min Yoo, et al., A Switched-Capacitor RF Power Amplifier, IEEE Journal of Solid-State Circuits, vol. 46 No. 12, Dec. 2011.
Debopriyo Chowdhury, et al., A Fully-Integrated Efficient CMOS Inverse Class-D Power Amplifier for Digital Polar Transmitters, IEEE Journal of Solid-State Circuits, vol. 47 No. 5, May 2012.
Song Hu, et al., A Broadband Mixed-Signal CMOS Power Amplifier With a Hybrid Class-G Doherty Efficiency Enhancement Technique, IEEE Journal of Solid-State Circuits, vol. 51 No. 3, Mar. 2016.

* cited by examiner

*Primary Examiner* — Shawkat M Ali
(74) *Attorney, Agent, or Firm* — Harness, Dickey & Pierce PLC

(57) ABSTRACT

Different techniques are presented for achieving enhanced linearity of digital transmitters. In one aspect, each unit cell of a switched capacitor circuit includes a capacitor electrically coupled via a switch to one of a drive voltage or a reference voltage, and the switch is implemented by two transistors coupled in series. The two transistors are transitioned between on and off states by control signals applied to control terminals of the two transistors, such that the control signals are pulse waves with edges temporally shifted in relation to each other and thereby reducing switching resistance during switch transitions.

14 Claims, 13 Drawing Sheets

LINEARIZATION TECHNIQUES FOR WIRELESS DIGITAL TRANSMITTERS

CROSS-REFERENCE TO RELATED APPLICATIONS

This application claims the benefit of U.S. Provisional Application No. 62/975,862, filed on Feb. 13, 2020. The entire disclosure of the above application is incorporated herein by reference.

FIELD

The present disclosure relates to linearization techniques for wireless digital transmitters.

BACKGROUND

In the recent times, small form factor, low power consumption, and low cost along with large-scale integration are essential for several mobile and wearable systems with wireless communication. Of late, the demand for cutting-edge cellular applications, such as fifth-generation (5G) cellular communications providing high data rates, and wireless connection among several devices over the internet, such as the Internet of Things (loT), has rapidly increased. Therefore, to keep pace with technological innovation and benefit more people, it is crucial to develop compact, power-efficient, and low-cost wireless communication solutions. The advancement of complementary metal oxide semiconductor (CMOS) technology is expediting the development of these solutions by means of enabling high density, low cost, and low power consumption for digital integrated circuits. A significant part of wireless communication systems comprises digital circuits such as digital signal processors (DSPs). However, in a wireless communication system, if the bulky and high power-consuming analog and radio frequency (RF) functions can be replaced with the maximum number of digital functions as possible, the wireless communication system can significantly benefit from the advancement of CMOS technology.

As wireless communication standards evolve, transmit systems with a higher linearity and wider bandwidth at increased output power (POUT) are required to meet the high demand for enhanced communication speeds and increased data traffic. Meanwhile, mobile and wearable applications demand a smaller form factor and low-cost solution. Low power consumption is also critical for increased battery life, enhanced user experience, and multi-standard and multi-input multi-output (MIMO) systems with multiple transceivers (TRXs) in a single system.

Additionally, high energy efficiency, especially at power back-off (PBO), is also required. Furthermore, along with the increasing demand for high data rates with the finite frequency bandwidth, highly-spectrally-efficient modulation schemes such as high-order quadrature amplitude modulation (QAM) orthogonal frequency-division multiplexing (OFDM) are essential for wireless communication systems. However, the complex modulation schemes usually require a large peak-to-average power ratio (PAPR) (e.g., 10 to 13 dB) and this forces the transmitter to operate in the deep PBO region. Furthermore, TX $P_{OUT}$ changes with the requirement for a transmit power control (TPC), and high efficiency for a wide range of $P_{OUT}$ is required in the modern communication systems.

The conventional transmitter architecture has long been the standard architecture because it enables easy and efficient analog signal processing such as control gain and filtering. However, the conventional TX sub-blocks occupy a large area and consume high static current even when delivering a low $P_{OUT}$. Moreover, it is difficult to benefit from the CMOS process migration because the process scaling cannot be directly applied to the analog sub-blocks.

On the other hand, the digital TXs or digital PAs, which use an array of small unit PA cells controlled by a digital code word to modulate amplitude and phase, have exhibited significant promise towards small and low-power transmitters. The digital TXs can save a significant amount of power consumption and area because they combine the function of the DAC, upconversion mixer, DA, and PA into a single circuit block. The digital TX with the advanced process technology is even more beneficial, providing faster switching and finer segmentation at a lower power dissipation. However, it is not easy to maintain high linearity in RFDAC because POUT and the operating frequency of the RFDAC are typically much higher than those of the baseband DAC. Therefore, this disclosure presents techniques for achieving enhanced linearity of digital transmitters.

This section provides background information related to the present disclosure which is not necessarily prior art.

SUMMARY

This section provides a general summary of the disclosure, and is not a comprehensive disclosure of its full scope or all of its features.

Different techniques are presented for achieving enhanced linearity of digital transmitters. The digital transmitter is comprised of a digital signal processor; and a switched capacitor circuit interfaced with the digital signal processor. The switched capacitor circuit includes a plurality of unit cells arranged in parallel. During operation, the switched capacitor circuit is configured to receive a digital input code from the digital signal processor and modulates an RF signal in accordance with the digital input code.

In one aspect, each unit cell includes a capacitor electrically coupled via a switch to one of a drive voltage or a reference voltage, and the switch is implemented by two transistors coupled in series. The two transistors are transitioned between on and off states by control signals applied to control terminals of the two transistors, such that the control signals are pulse waves with edges temporally shifted in relation to each other and thereby reducing switching resistance during switch transitions.

In another aspect, the plurality of unit cells comprising the switched capacitor circuit are partitioned into a first subset of unit cells and a second subset of unit cells. Switches in the first subset of unit cells are switched between the drive voltage and the reference voltage in accordance with a switching signal while switches in the second subset of unit cells remain unswitched. Amongst the switches in the second subset of unit cells, half of the switches in the second subset of unit cells are electrically coupled to the drive voltage and other half of the switches in the second subset of unit cells are electrically coupled to the reference voltage.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
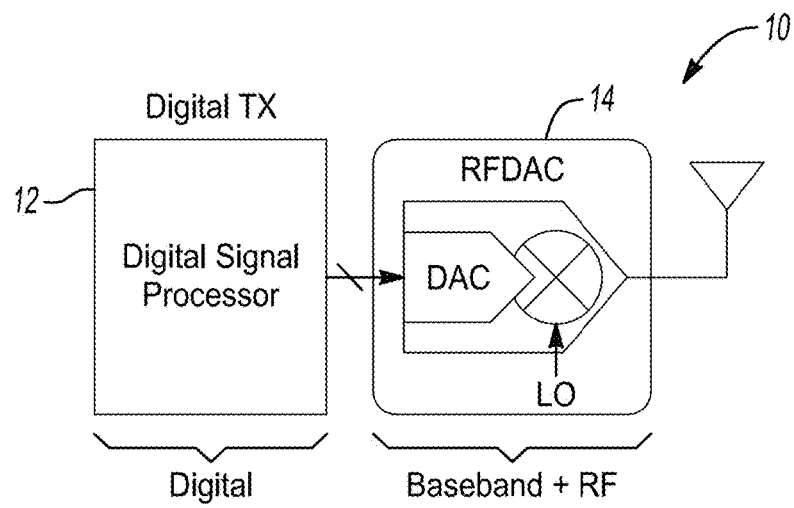
FIG. 1 is a diagram of a digital transmitter.

FIG. 1 depicts a digital transmitter 10 (or digital power amplifier). The digital transmitter 10 includes a digital signal processor 12 interfaced with a RF digital-to-analog converter (RFDAC) 14. The RFDAC 14 is configured to receive a digital input code from the digital signal processor 12 and modulates an RF signal in accordance with the digital input code. The RFDAC 14 saves significant amount of power consumption and area because they combine the functions of the DAC, upconversion mixer, a driving amplifier and a power amplifier into a single circuit block. To do so, the RFDAC 14 uses a switched capacitor power amplifier (SCPA) which is also referred to herein as a switched capacitor circuit.

Figure 2:
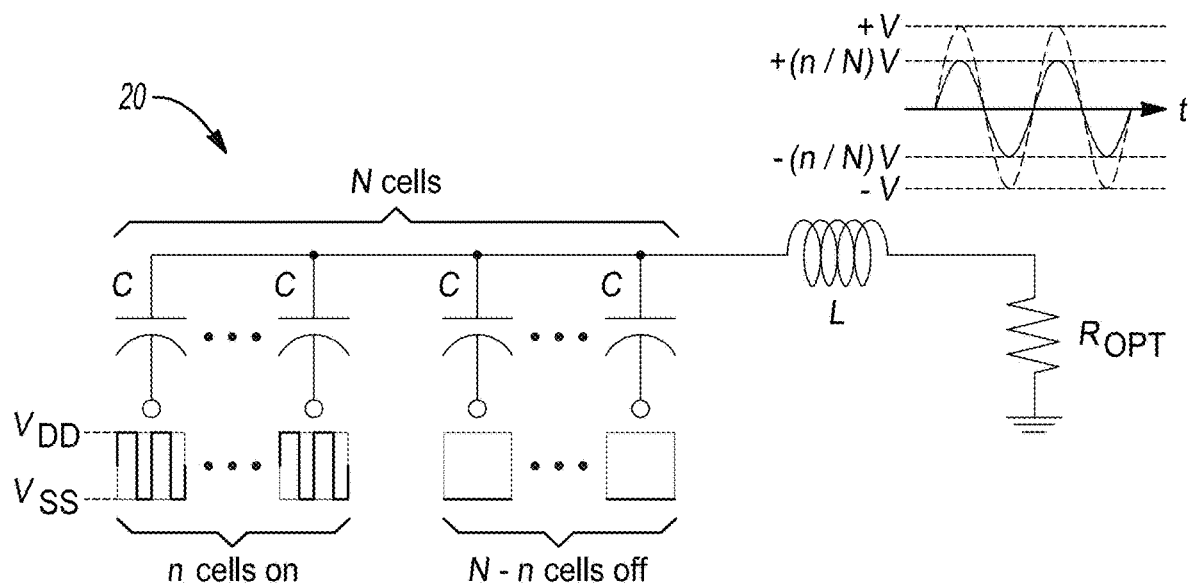
FIG. 2 is a schematic of a basic architecture for a switched capacitor power amplifier.

FIG. 2 presents a basic schematic of a conventional SCPA architecture. The switched capacitor circuit 20 is comprised of a plurality of unit cells arranged in parallel. Each unit cell includes a capacitor C. The capacitors in the capacitor array are selectively switched at RF for the generation RF POUT. Assuming that an ideal inductor L is in series with the capacitor array, the square wave at the capacitor top plate is filtered by an ideal bandpass network. Further assuming that the filter is ideal, only a fundamental component is delivered at the output. The equivalent circuit of the capacitor array is connected in series with an inductor L and output resistor ROPT for calculating the POUT and ideal drain efficiency of the switched capacitor circuit.

Figure 3:
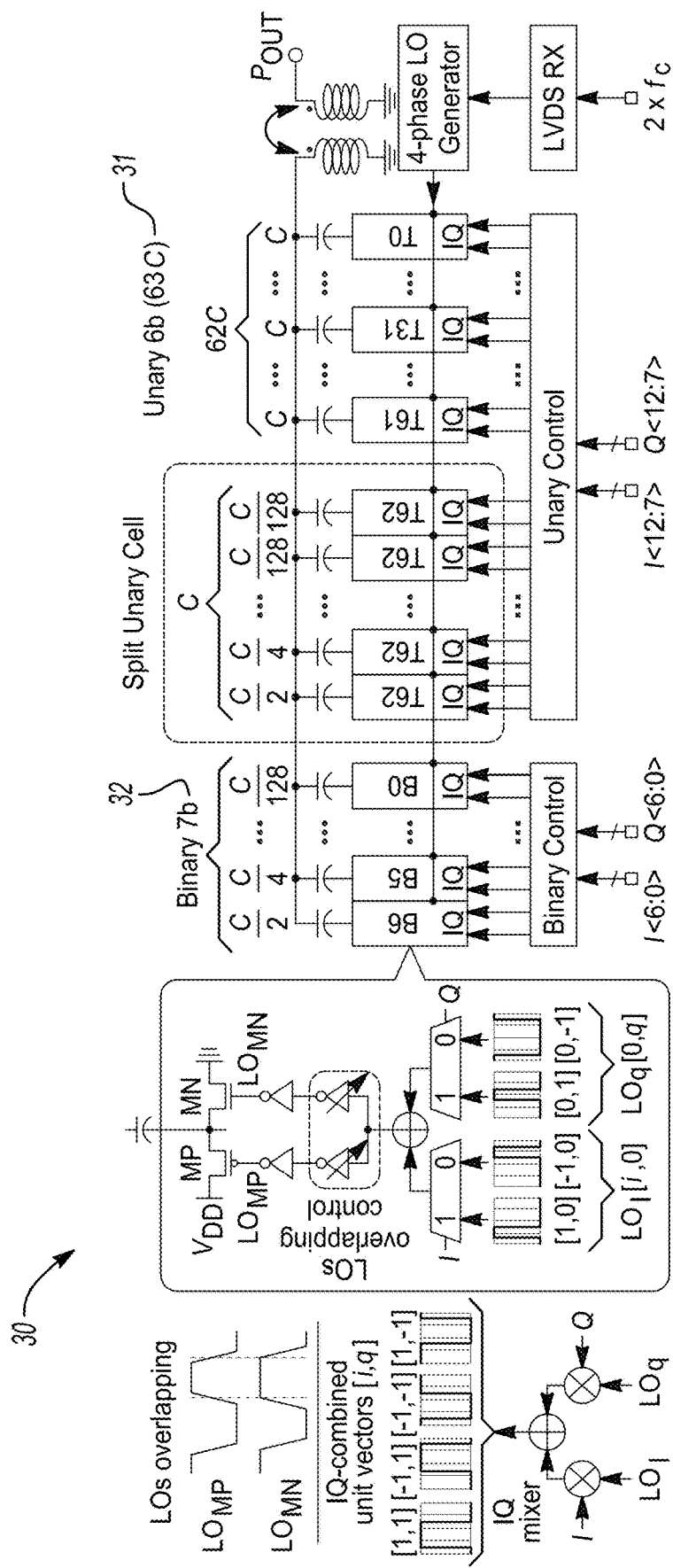
FIG. 3 is a diagram depicting an overall architecture for a thirteen bit switched capacitor RF digital-to-analog converter.

An example architecture of a 13-bit digital transmitter 30 is presented in FIG. 3. The digital I/O bits are directly converted into the corresponding RF signal by a single quadrature SC RFDAC. In an example embodiment, an IQ cell sharing with a 25% duty cycle LO signal is used. 6-bit unary cells 31 along with 7-bit binary cells 32 are utilized to achieve a 13-bit resolution in a small area with low power consumption although other combinations of unary cells and binary cells are contemplated by this disclosure. For an RFDAC with low POUT, chip area and power consumption are dominated by the total number of unary/binary cells, logic gates and flip-flops, and associated LO distribution in a less advanced CMOS technology node. Even though many unary cells are preferred for excellent linearity, the complexity, area, and power consumption double with each additional bit. The number of unary cells can be reduced by using more binary cells. Besides careful layout techniques, linearity is improved significantly using on-resistance linearization techniques for both switched and unswitched transistors in the DAC array with an RFDAC code-mapping technique as will be further described below.

Figure 4:
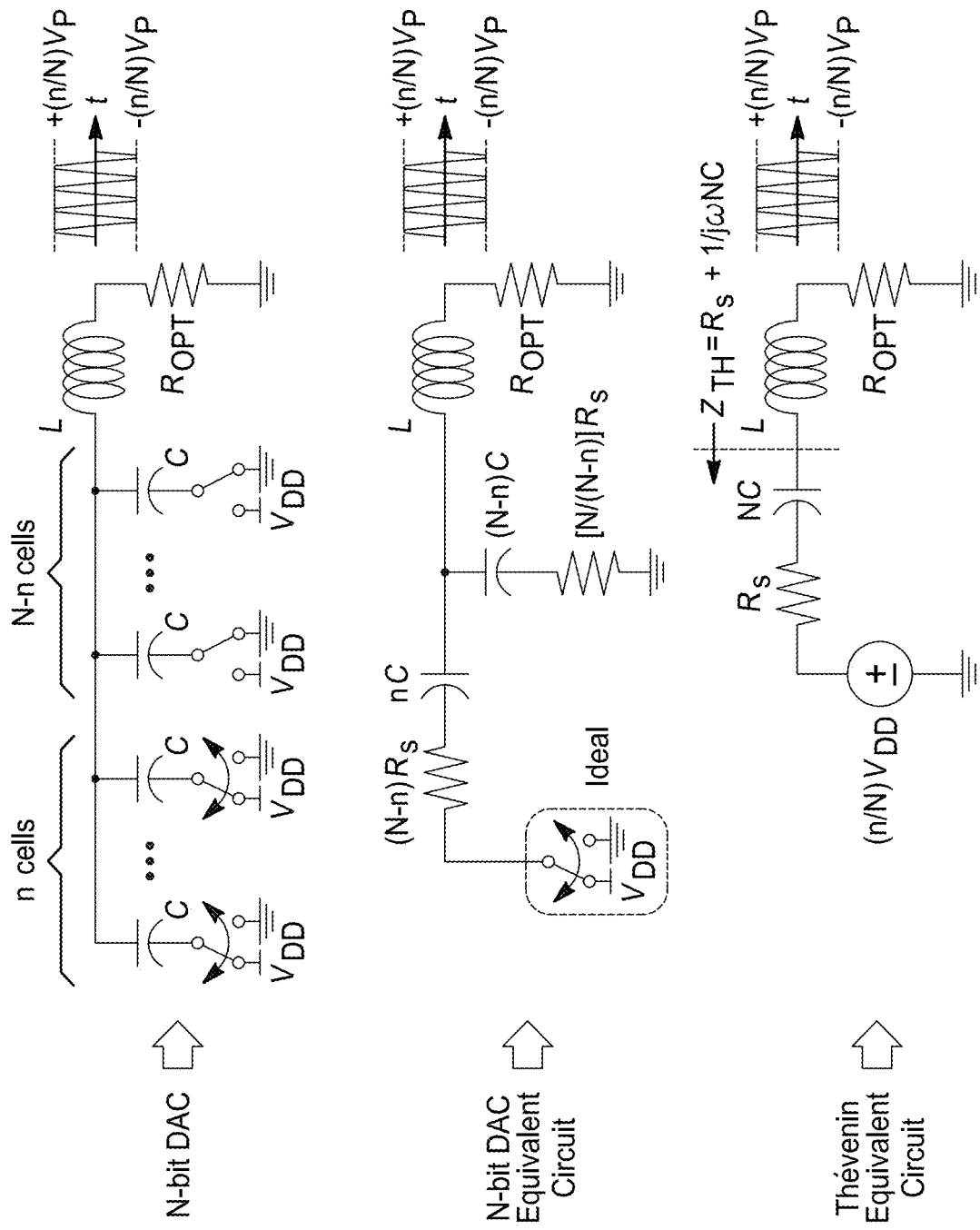
FIG. 4 is a schematic for SC RFDAC with nonlinear switch resistance.

Linearity goals for information-dense, wideband standards such as 802.11ax, without DPD have not been attained by conventional digital transmitters. An equivalent circuit that includes unideal resistive parasitics in both switched and unswitched capacitors is illustrated in FIG. 4. Nonlinearity is introduced if the source resistance in the Thévenin equivalent circuit, $R_S$, changes according to the number of switched cells. However, if source resistance is either very low, or high even though constant, excellent linearity can be achieved. The combined impedance of switched/unswitched P-type metal-oxide-semiconductor (PMOS) and N-type metal-oxide-semiconductor (NMOS) transistors changing with the input codes determines source resistance as illustrated FIG. 5A. The dynamic changes in source resistance are attributed to following two major factors: (1) finite switching duration with changing impedance and (2) on-resistance mismatch between the PMOS and NMOS switches.

Figure 5A:
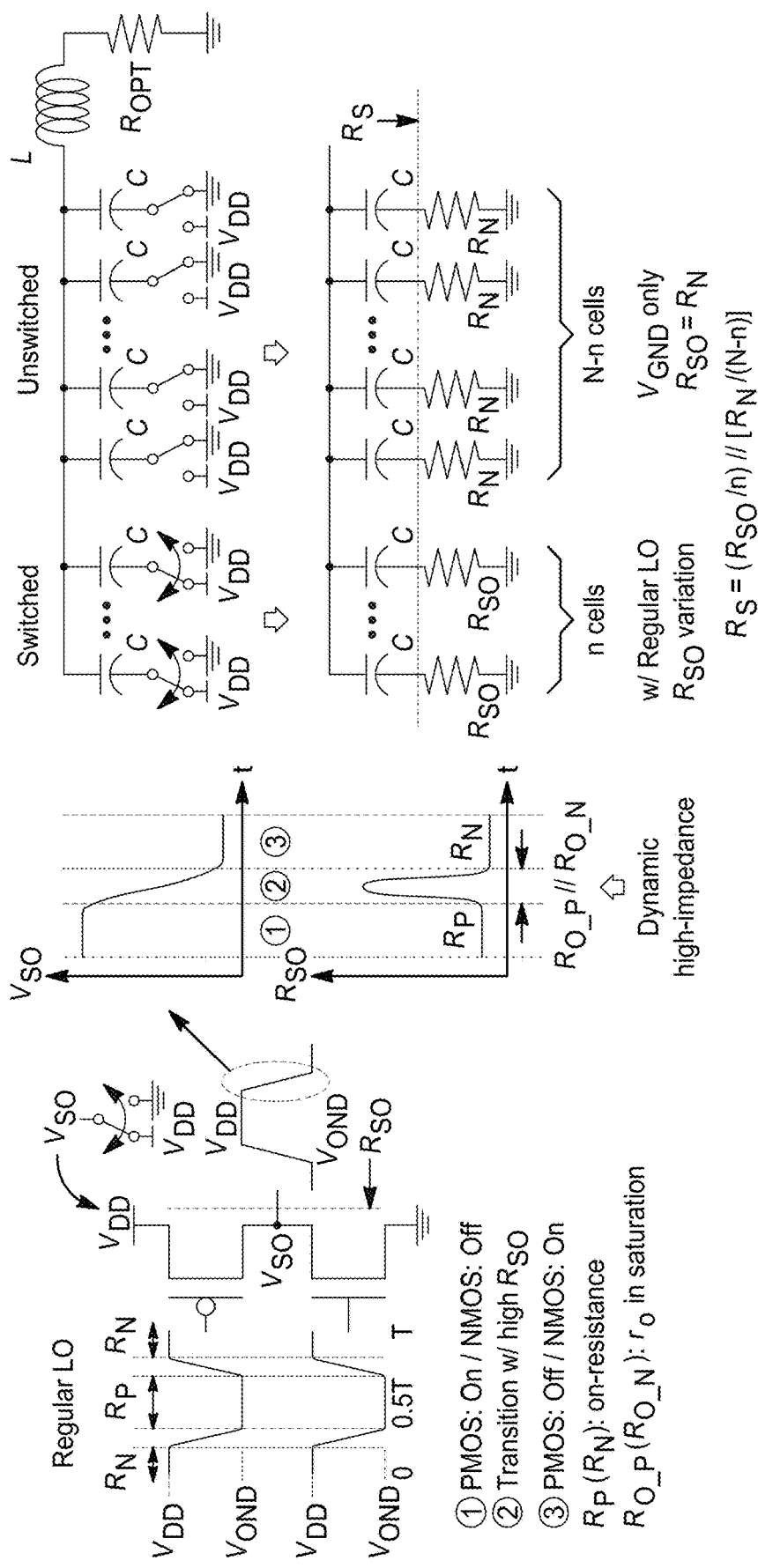
FIG. 5A is a diagram illustrating switch impedance for a conventional SC RFDAC.
Figure 5B:
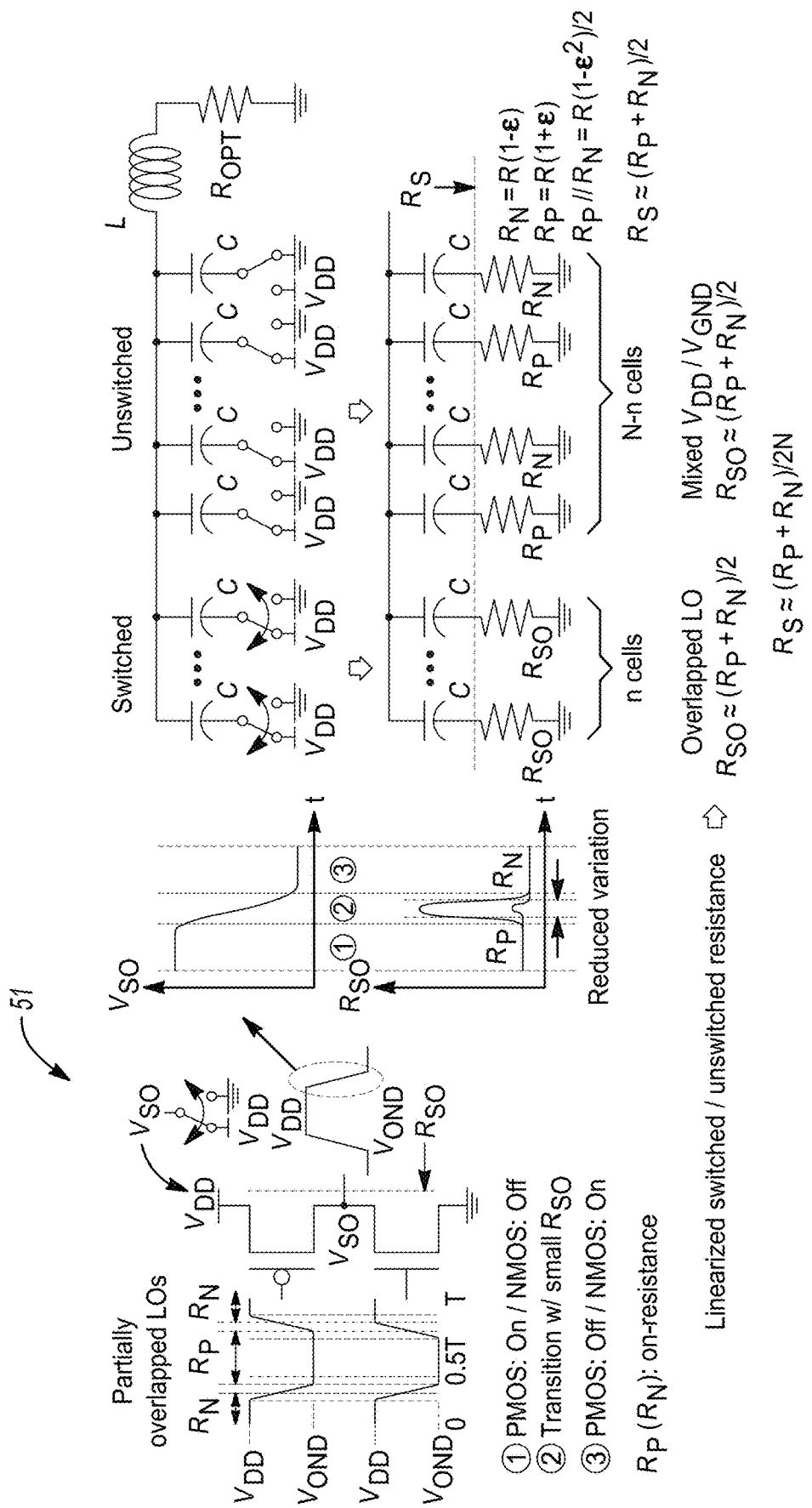
FIG. 5B is a diagram illustrating switch impedance for an improved SC RFDAC.

With reference to FIG. 5B, two switch linearization techniques are employed for the high $P_{OUT}$ region. First, partially overlapping clocks provide a more constant on-resistance for the switching transistors as compared to the on-resistance provided by regular clocks during switching transitions while minimizing dynamic high-impedance states to achieve better linearity.

Each unit cell in the switched capacitor circuit includes a capacitor. The capacitor is in turn electrically coupled via a switch to one of a drive voltage ($V_{DD}$) or a reference voltage (e.g., electrical ground). In an example embodiment, the switch is implemented by two transistors coupled in series as indicated at 51, where the two transistors are transitioned between on and off states by control signals applied to control terminals of the two transistors. More specifically, the two transistors are a P-type metal oxide semiconductor (PMOS) transistor in series with an N-type metal oxide semiconductor (NMOS) transistor. This is merely an example implementation for the switch and other implementations fall within the scope of this disclosure.

During operation, the control signals applied to the control terminals of the two transistors are temporally shifted in relation to each other, thereby reducing switching resistance during switch transitions. In one embodiment, the control signals are pulse waves with edges temporally shifted in relation to each other. In another embodiment, the control signals are shifted in voltage domain. For example, a sine wave with different DC voltage is applied to the control terminals. Unwanted large impedance fluctuations are avoided as shown in FIG. 5B. Assuming a 50% duty cycle and a minimal high-impedance period, the parasitic resistance of each switch pair ($R_{SO}$) connected to a unit capacitor is approximately ($R_P+R_N$)/2.

Different techniques for shifting the control signals in relation to each other are envisioned by this disclosure. In a general sense, the switch in each unit cell further includes at least one additional active device (e.g., an inverter or transistor) and the control signal applied to the two transistors are shifted by biasing the at least one active device.

Figure 6A:
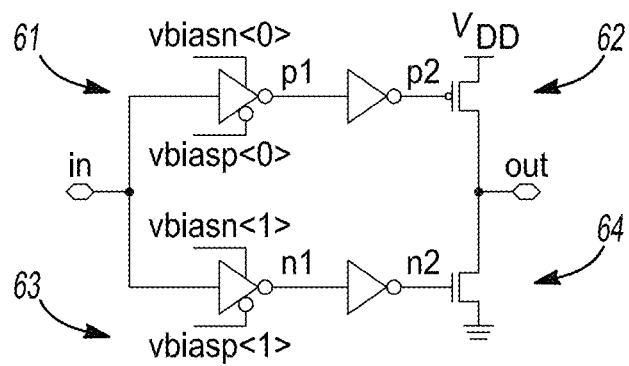
FIG. 6A is a schematic of an example drive circuit for shifting the control signals in relation to each other in accordance with this disclosure.
Figure 6B:
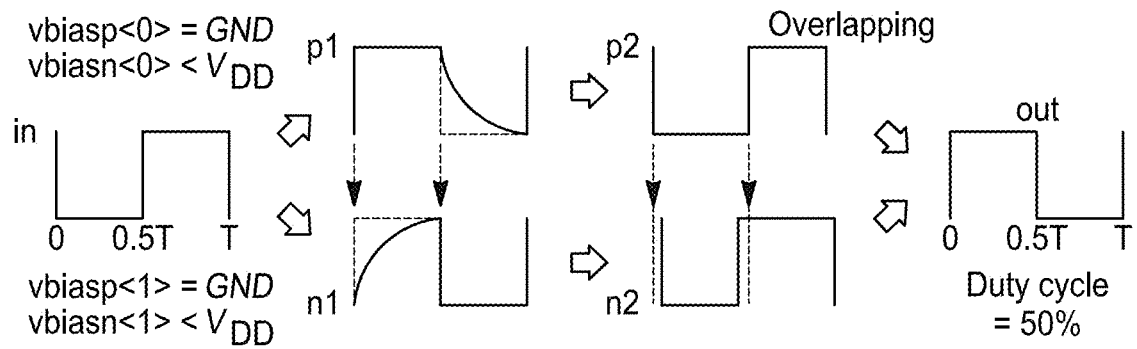
FIG. 6B is a diagram illustrating the control signals in the drive circuit of FIG. 6A.

In FIG. 6A, an upper driver circuit 61 is electrically coupled to the control terminal of PMOS transistor 62 and a lower driver circuit 63 is electrically coupled to the control terminal of NMOS transistor 64. The upper drive circuit 61 and the lower drive circuit 63 are configured to receive an input control signal and outputs the control signal to the control terminal of the PMOS transistor 62 and the control terminal of the NMOS transistor 64, respectively. In this example, the upper drive circuit and lower drive circuit are defined as two inverters coupled in series. One inverter may suffice in other implementations. In either case, an inverter in each drive circuit is biased to shift the control signals in an overlapping manner. The resulting control signals are shown in FIG. 6B.

Figure 7A:
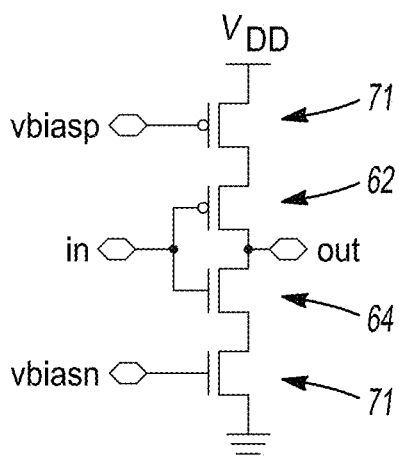
FIG. 7A is a schematic of another example drive circuit for shifting the control signals in relation to each other.
Figure 7B:
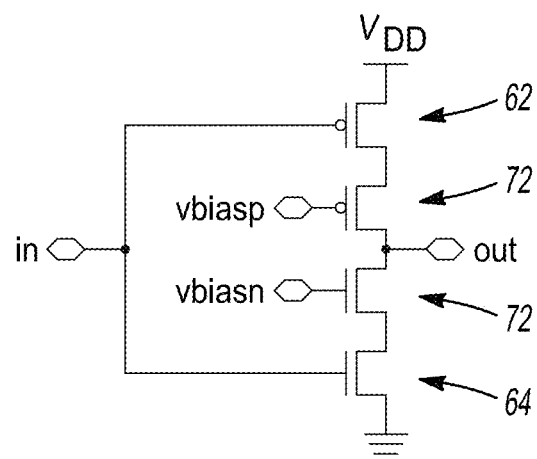
FIG. 7B is a schematic of yet another example drive circuit for shifting the control signals in relation to each other.

In an alternative approach, the switch in each unit cell further includes a first biasing transistor coupled in series with the PMOS transistor and a second biasing transistor coupled in series with the NMOS transistor. In one embodiment, the biasing transistors 71 may be arranged outside of the PMOS transistor 62 and the NMOS transistor 64 as shown in FIG. 7A. In another embodiment, the biasing transistors 72 may be arranged between the PMOS transistor 62 and the NMOS transistor 64 as shown in FIG. 7B. In either case, the control signals applied to the PMOS transistor and the NMOS transistor are temporally shifted in relation to each other by applying a biasing voltage to control terminals of the first biasing transistor and the second biasing transistor. Oher techniques for shifting the control signals in relation to each other also fall within the scope of this disclosure.

In a conventional SC RFDAC in which all unswitched capacitors are connected to VGND, the ground-path parasitic resistance is a function of $R_N$ only, as illustrated FIG. 5A. For the unswitched capacitors, a second linearization technique is illustrated in Figured 5B.

Depending upon the digital input code, the plurality of unit cells are partitioned into a first subset of unit cells and a second subset of unit cells. Switches in the first subset of unit cells are switched between the drive voltage and the reference voltage in accordance with the control signals while switches in the second subset of unit cells are not switched. For the second subset of unit cells, half of the switches are electrically coupled to the drive voltage and the other half of the switches are electrically coupled to the reference voltage. IN this way, the source resistance for each unswitched capacitor is also approximately (RP+RN)/2. Furthermore, in differential implementation, the alternate array has exactly the opposite connection to VDD and VGND. These techniques provide enhanced switch linearity over a wide POUT range, especially for a digital transmitter in older CMOS technologies with slow switches (e.g., 65 nm vs. 28 nm) or at higher operating frequencies.

In another aspect of this disclosure, a code mapping technique is presented for improving linearization for RFDAC. For a DAC, cells require segmentation into unary and binary cell groups for optimizing area and power consumption, while maintaining the required accuracy. The linearity of the DAC can be degraded due to the mismatch between the unary and binary cell groups and among the binary cells. For the digital transmitter with an RFDAC, nonlinearity occurs in both amplitude and phase domain owing to the mismatches. Even though the mismatches can be reduced by careful design and layout, the mismatches that are retained due to the PVT variation and imperfect phase calibration among the cells still limit the linearity of the digital TX.

Figure 8:
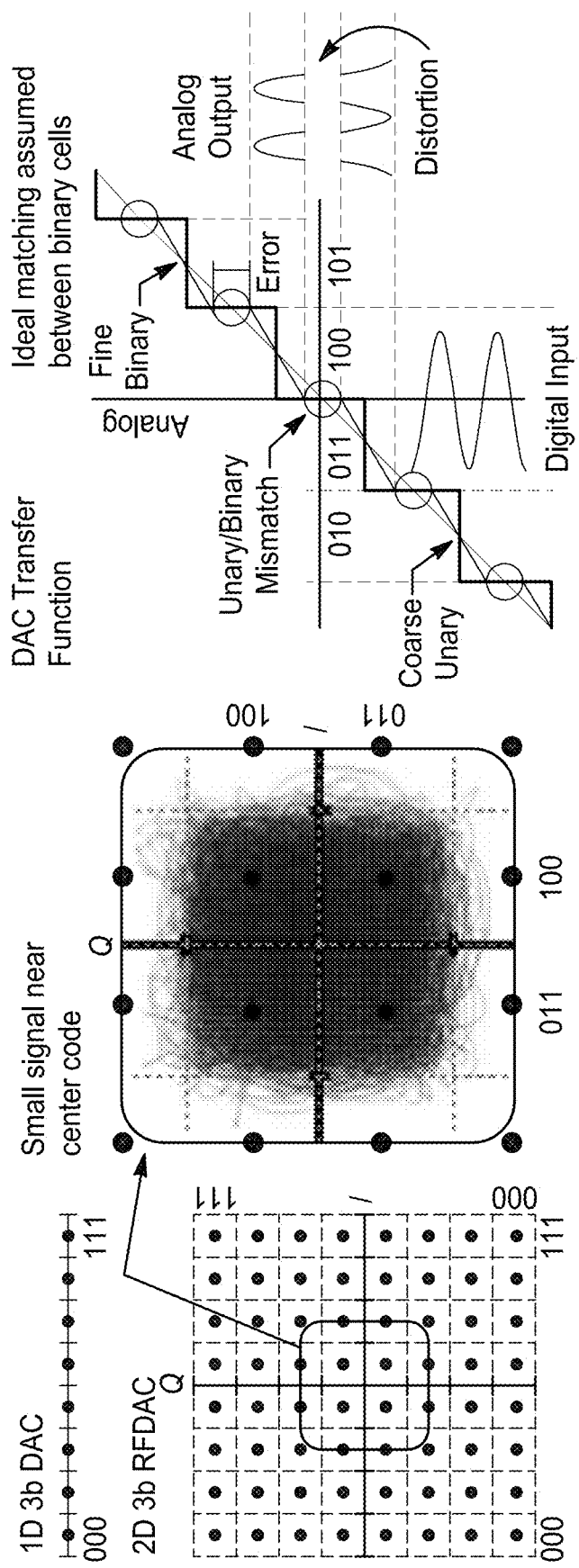
FIG. 8 show an example of linearity degradation from the mismatch between unary and binary cell groups.

FIG. 8 demonstrates an instance of the mismatch between the unary and binary cell groups for 1-D/2-D DACs with 3-bit unary cells; each coarse unary-code region (red) is divided into finer binary-code regions (blue). At a low $P_{OUT}$, the RFDAC operation involves the switching of a few unary cells and relatively more binary cells. Assuming the unary and binary cells do not match perfectly, maximum mismatch occurs at unary cell transitions where all the binary cells are also switching.

Figures 9A, 9B, 9C:
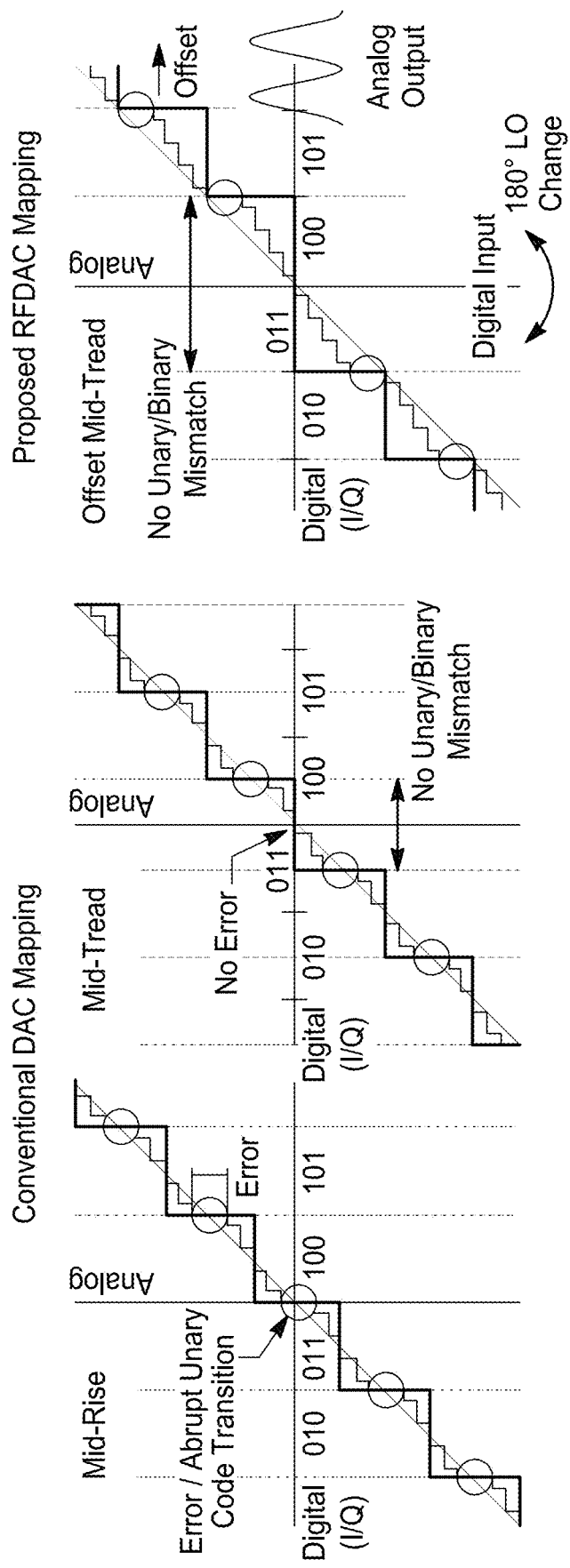
FIGS. 9A-9C are graphs comparing mid-rise, mid-tread and offset mid-tread mapping techniques, respectively, for a one dimensional digital-to-analog.
Figure 10C:
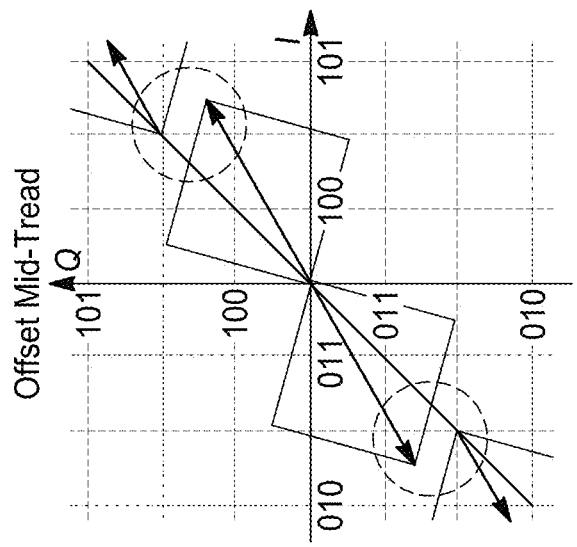
FIGS. 10A-10C are graphs comparing mid-rise, mid-tread and offset mid-tread mapping techniques, respectively, for a two dimensional digital-to-analog.
Figure 10B:
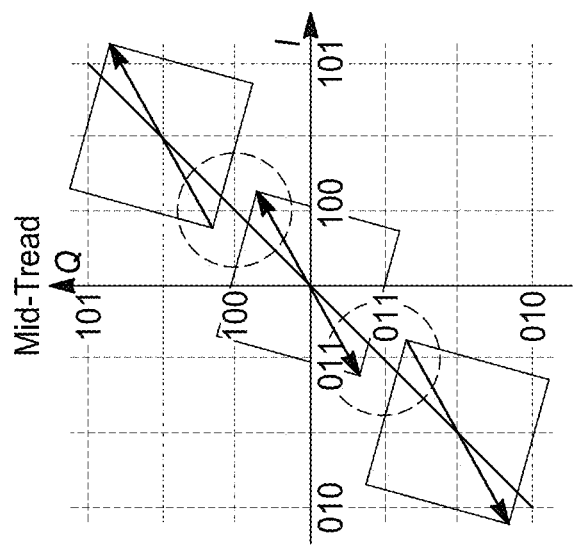
Figure 10A:
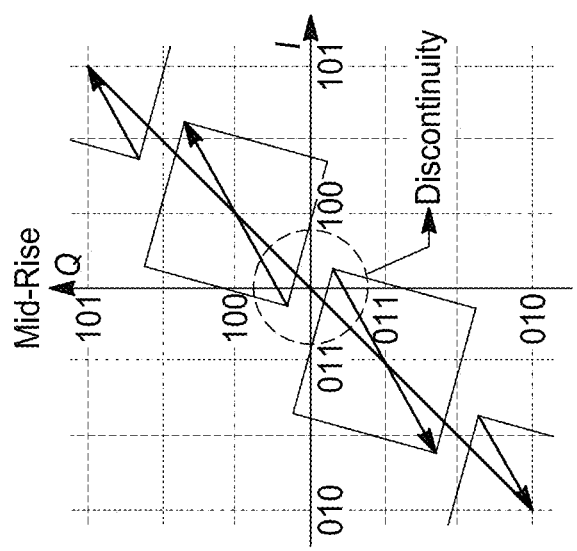

An offset-mid-tread mapping technique for the RFDAC that achieves high linearity at low $P_{OUT}$ is introduced. A conventional mid-rise mapping presented in FIG. 9A has an abrupt unary code transition at the origin, which dominates nonlinearity at low $P_{OUT}$. FIG. 9B shows conventional mid-tread mapping with no unary-code transition at the origin improves linearity, but the adjacent transitions still occur at relatively low $P_{OUT}$. The low $P_{OUT}$ linearity is increased using the proposed offset mid-tread code-mapping method presented in FIG. 9C where no unary cell transition occurs at the origin and code distances to the first transitions are doubled compared to conventional mid-tread mapping. In a similar manner, the delay (phase) nonlinearities are reduced as illustrated in FIGS. 10A-10C. The presented mapping is especially effective for a RFDAC that does not use a conventional mixer with its attendant transmit LO leakage and concomitant DC offset calibration.

Figure 11:
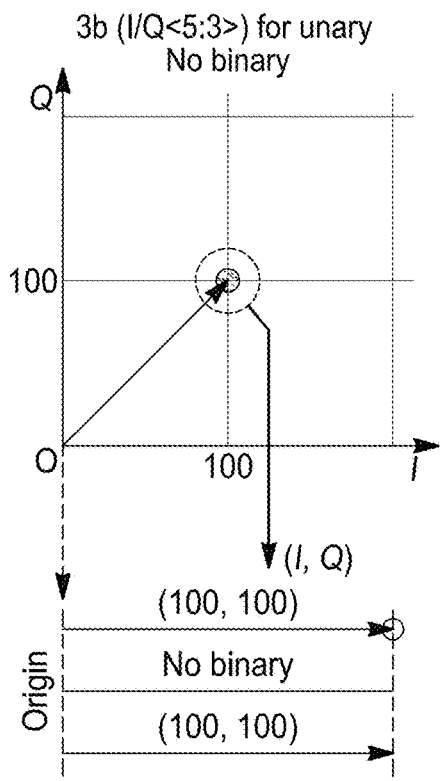
FIG. 11 illustrates a conventional mid-rise code mapping.
Figure 11:
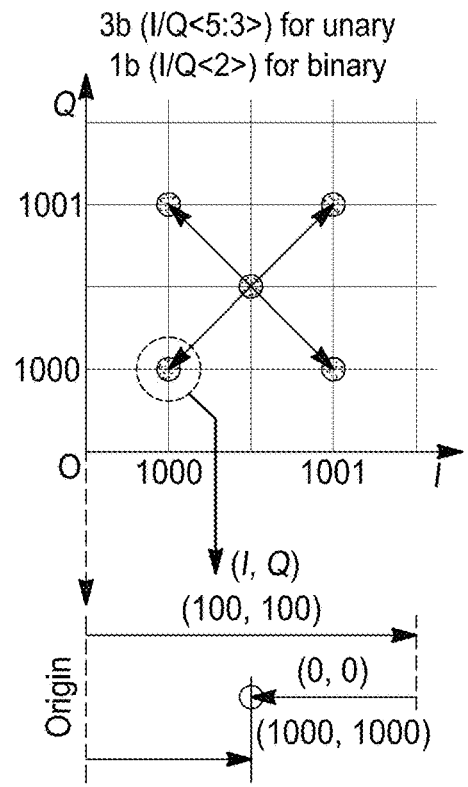
Figure 11:
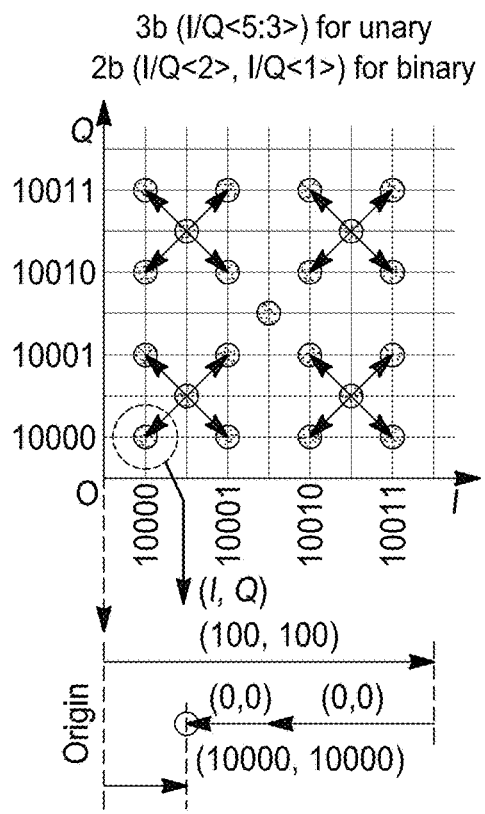
Figure 11:
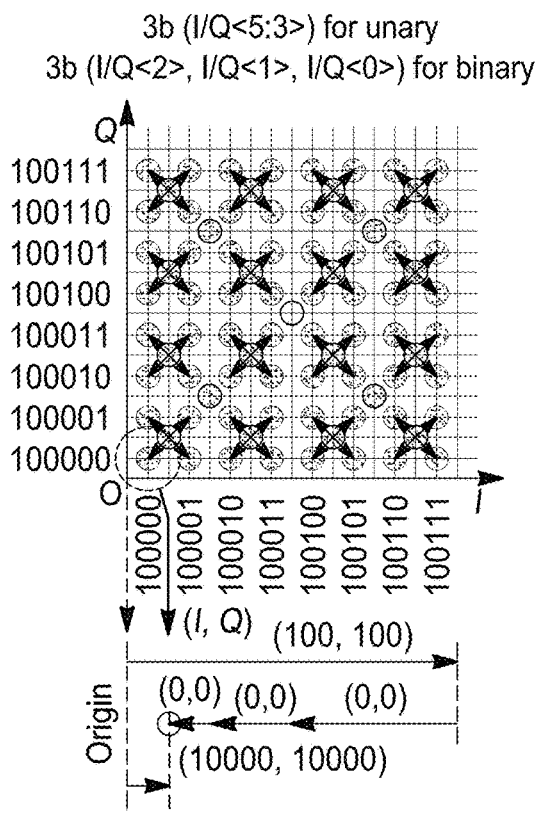
Figure 12:
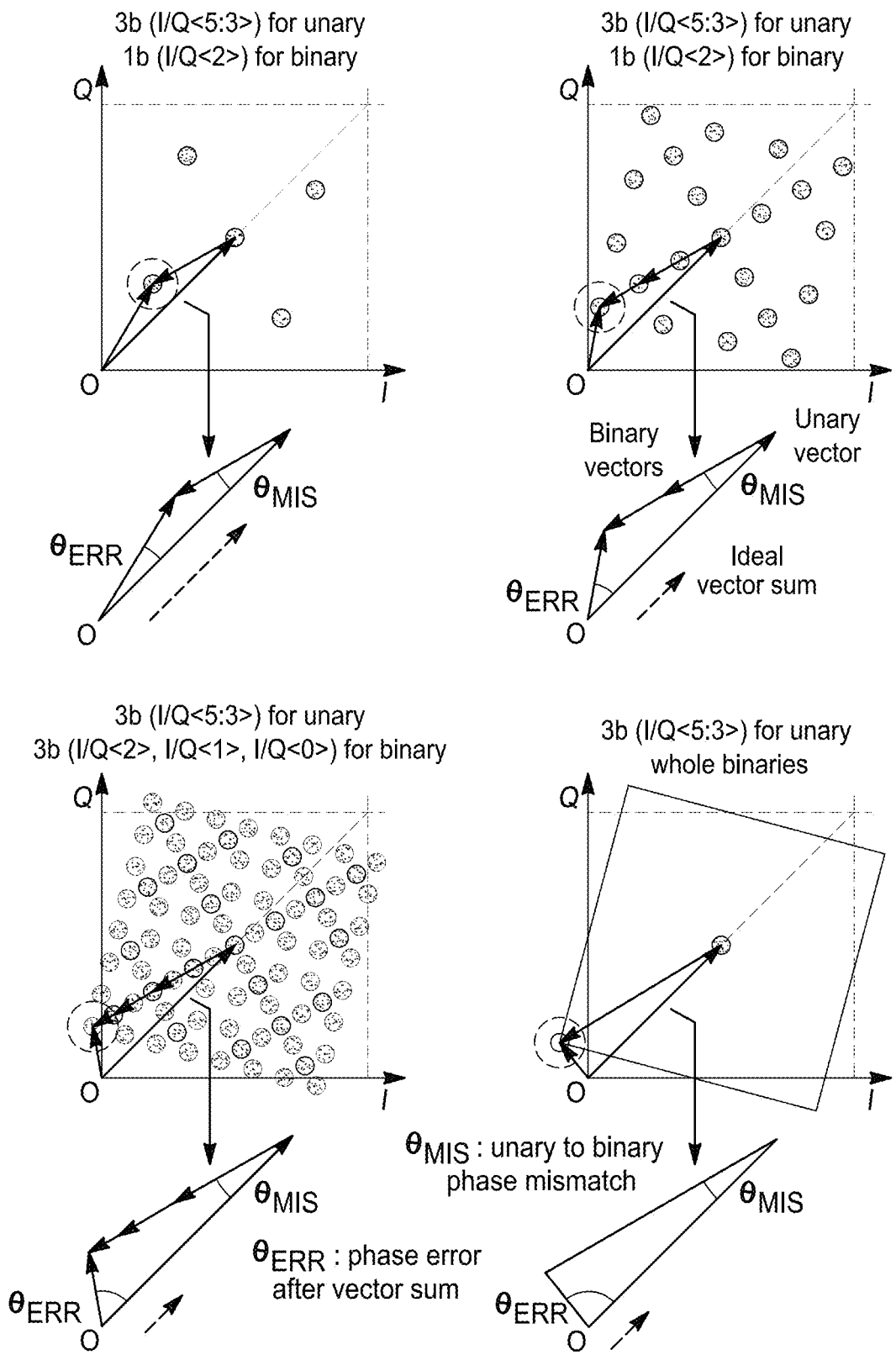
FIG. 12 illustrates a conventional mid-rise code mapping with phase mismatch between unary and binary cell groups.

FIG. 11 illustrates a conventional mid-rise code mapping. The conventional mid-rise code mapping represents the deepest PBO region by merging a single unary vector and multiple binary vectors, which are 180° OOP from each other. Therefore, the mismatch between the unary and binary vectors leads to an abrupt transition near the origin in the IQ plane, as illustrated in FIG. 12. In this example, for simplicity, it is assumed that there is only phase mismatch ($\theta_{MIS}$) between the two cell groups, and all the binary vectors are ideally matched.

Figure 13:
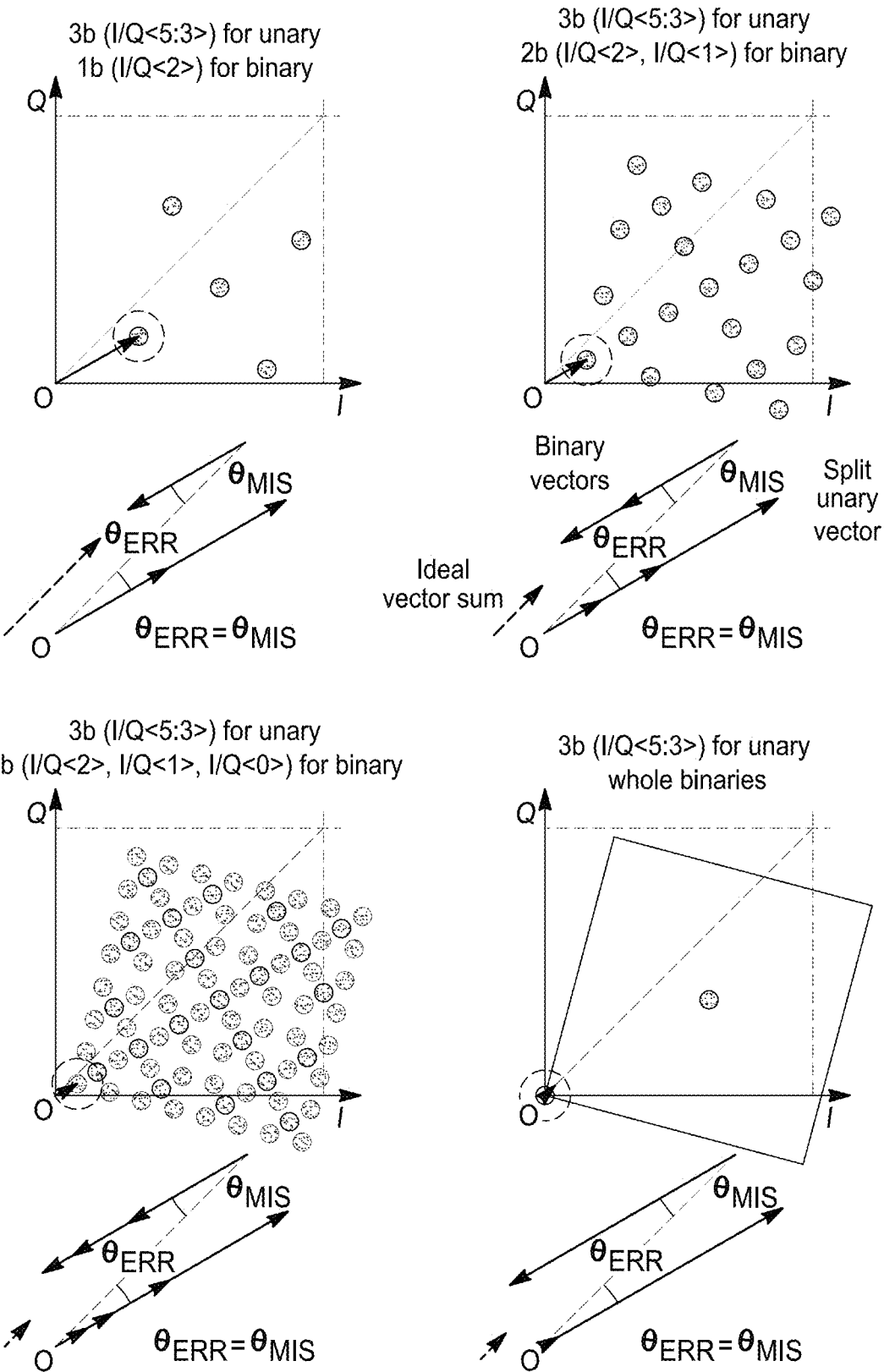
FIG. 13 illustrates an offset mid-tread code mapping with a phase mismatch between unary and binary cell groups.

Unlike the conventional mid-rise technique, the proposed offset mid-tread technique represents the deepest PBO region only with the binary-weighted vectors, preventing the abrupt transition near the origin in the IQ plane as illustrated in FIG. 13.

Even if the $\theta_{MIS}$ between the unary and binary cell groups in FIGS. 12 and 13 are the same, the phase distortion ($\theta_{ERR}$) of the vector sum is considerably improved by the offset mid-tread code mapping, as illustrated in FIG. 13. The $\theta_{ERR}$ is the same as $\theta_{MIS}$ in the proposed offset mid-tread code mapping.

Figure 14:
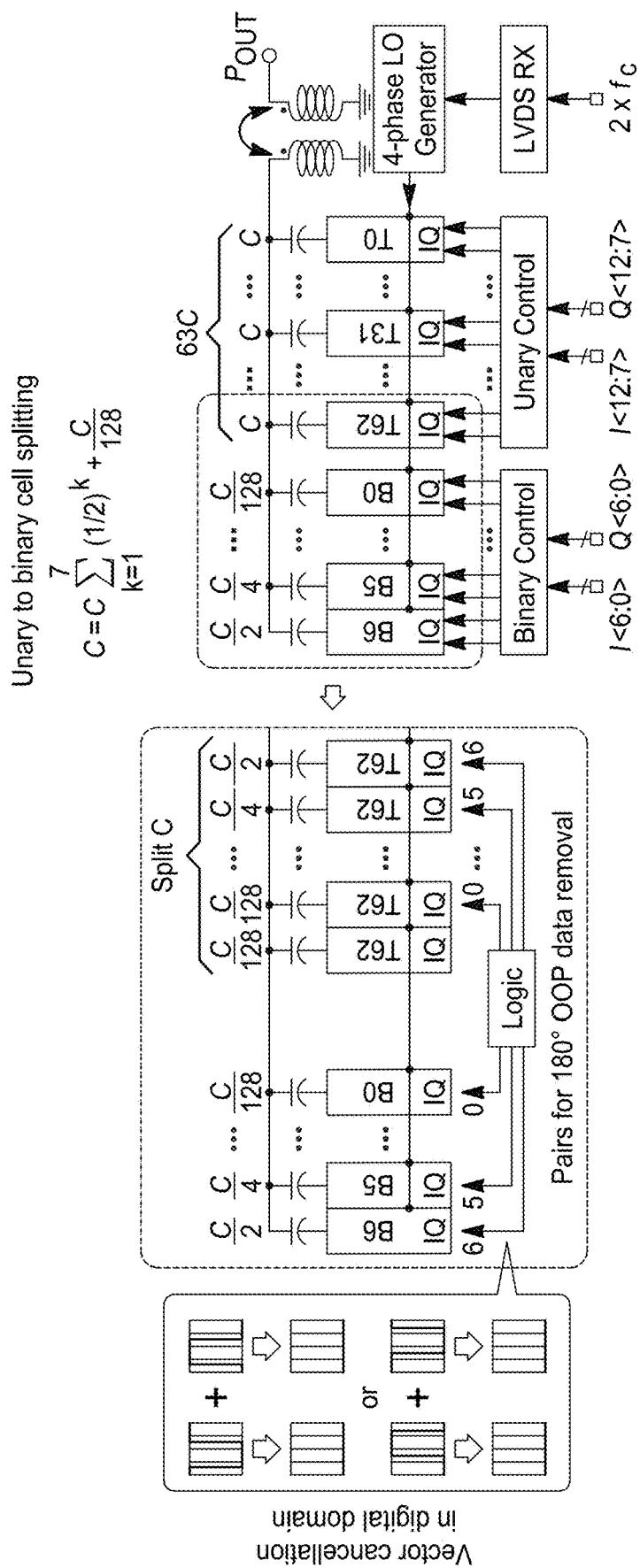
FIG. 14 is a diagram of an example implementation of the proposed offset mid-tread code mapping technique.

To implement the proposed mid-tread code mapping, a single unary vector is split into multiple binary-weighted vectors with the same resolution as the binary vectors in the SC RFDAC. Therefore, vector cancellation occurs between the split unary and corresponding binary-weighted split-unary vectors when they have 180° OOP relations. Because the split-unary vector better matches the binary vectors than a single unary vector, the linearity at the deepest PBO region significantly improves, as shown in FIG. 13. For further enhanced linearity, a digital domain vector removal technique is applied between the split-unary and binary vectors, as illustrated in FIG. 14. Even if the split-unary vector matches the binary vectors better than a single unary vector, mismatches between the split-unary and binary vectors can persist. The digital domain vector removal technique completely cancels out the errors and leaves no residual mismatches by pairing the vector with 180° OOP relations and deactivating those cells. By employing the offset mid-tread code mapping, the unary code of the TX output can be defined without any discontinuity at the origin in the IQ plane, and the discontinuity due to the unary code transition shifts to the higher $P_{OUT}$ region. This is because the unary vectors only become activated after both split-unary and binary vectors are fully turned on with the same phase.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A digital transmitter, comprising:
a digital signal processor; and
a switched capacitor circuit interfaced with the digital signal processor, wherein the switched capacitor circuit is comprised of a plurality of unit cells arranged in parallel, wherein the switched capacitor circuit is configured to receive a digital input code from the digital signal processor and modulates an radio frequency (RF) signal in accordance with the digital input code, and wherein:
each unit cell includes a capacitor electrically coupled via a switch to one of a drive voltage or a reference voltage, and the switch is implemented by two transistors coupled in series, and a controller interfaced with the transistors in each unit cell, where the controller operates to transition the transistors between on and off states by control signals applied to control terminals of the transistors, in a manner that the control signals are pulse waves with edges temporally shifted in relation to each other and in order to reduce switching resistance during switch transitions.

2. The digital transmitter of claim 1, wherein the switch in each unit cell further includes at least one additional active device and the control signals applied to the two transistors are temporally shifted by biasing the at least one active device.

3. The digital transmitter of claim 1, wherein the switch in each unit cell is further defined as a P-type metal oxide semiconductor (PMOS) transistor in series with an N-type metal oxide semiconductor (NMOS) transistor.

4. The digital transmitter of claim 3, wherein the switch in each unit cell further includes a upper driver circuit electrically coupled to the control terminal of the PMOS transistor and a lower driver circuit electrically coupled to the control terminal of the NMOS transistor, and wherein the upper drive circuit and the lower drive circuit are configured to receive an input control signal and operate to output the control signals applied to the control terminal of the PMOS transistor and the control terminal of the NMOS transistor, respectively.

5. The digital transmitter of claim 4, wherein each of the upper drive circuit and the lower drive circuit are further defined as two inverter circuit coupled in series.

6. The digital transmitter of claim 3, wherein the switch in each unit cell further includes a first biasing transistor coupled in series with the PMOS transistor and a second biasing transistor coupled in series with the NMOS transistor, in a manner that the control signals applied to the PMOS transistor and the NMOS transistor are temporally shifted in relation to each other by applying a biasing voltage to control terminals of the first biasing transistor and the second biasing transistor.

7. The digital transmitter of claim 1, wherein the plurality of unit cells are partitioned into a first subset of unit cells and a second subset of unit cells, switches in the first subset of unit cells are switched between the drive voltage and the reference voltage in accordance with the control signals while switches in the second subset of unit cells are not switched, in a manner that half of the switches in the second subset of unit cells are electrically coupled to the drive voltage and other half of the switches in the second subset of unit cells are electrically coupled to the reference voltage.

8. A digital transmitter, comprising:
a digital signal processor; and
a switched capacitor circuit interfaced with the digital signal processor, wherein the switched capacitor circuit is comprised of a plurality of unit cells arranged in parallel, wherein each unit cell includes a capacitor having one terminal coupled to a common node and another terminal coupled via a switch between a drive voltage and a reference voltage, and the plurality of unit cells are partitioned into a first subset of unit cells and a second subset of unit cells, and a controller interfaced with the switches in each unit cell, where the controller operates to alternately couple the switches in the first subset of unit cells switch to the drive voltage and the reference voltage in accordance with a switching signal while the switches in the second subset of unit cells remain unswitched, and wherein half of the switches in the second subset of unit cells are electrically coupled to the drive voltage and other half of the switches in the second subset of unit cells are electrically coupled to the reference voltage.

9. The digital transmitter of claim 8, wherein the switch in each unit cell is further defined as a P-type metal oxide semiconductor (PMOS) transistor in series with an N-type metal oxide semiconductor (NMOS) transistor.

10. The digital transmitter of claim 9, wherein the switch is each unit cell is implemented by two transistors coupled in series and the controller operates to transition the transistors between on and off states by control signals applied to control terminals of the transistors, in a manner that the control signals are shifted in relation to each other in order to reduce switching resistance during switch transitions.

11. The digital transmitter of claim 10, wherein the switch in each unit cell further includes at least one additional active device and the control signals applied to the transistors are temporally shifted by biasing the at least one active device.

12. The digital transmitter of claim 10, wherein the switch in each unit cell further includes a upper driver circuit electrically coupled to the control terminal of the PMOS transistor and a lower driver circuit electrically coupled to the control terminal of the NMOS transistor, and wherein the upper drive circuit and the lower drive circuit are configured to receive an input control signal and operate to output the control signals applied to the control terminal of the PMOS transistor and the control terminal of the NMOS transistor, respectively.

13. The digital transmitter of claim 12, wherein each of the upper drive circuit and the lower drive circuit are further defined as two inverter circuit coupled in series.

14. The digital transmitter of claim 10, wherein the switch in each unit cell further includes a first biasing transistor coupled in series with the PMOS transistor and a second biasing transistor coupled in series with the NMOS transistor, in a manner that the control signals applied to the PMOS transistor and the NMOS transistor are temporally shifted in relation to each other by applying a biasing voltage to control terminals of the first biasing transistor and the second biasing transistor.

* * * * *